(12) United States Patent
Szewerenko et al.

(10) Patent No.: US 7,579,687 B2
(45) Date of Patent: *Aug. 25, 2009

(54) CIRCUIT MODULE TURBULENCE ENHANCEMENT SYSTEMS AND METHODS

(75) Inventors: Leland Szewerenko, Austin, TX (US); Julian Partridge, Austin, TX (US); Wayne Lieberman, Austin, TX (US); Paul Goodwin, Austin, TX (US)

(73) Assignee: Entorian Technologies, LP, Austin, TX (US)

( * ) Notice: Subject to any disclaimer, the term of this patent is extended or adjusted under 35 U.S.C. 154(b) by 352 days.

This patent is subject to a terminal disclaimer.

(21) Appl. No.: 11/332,740

(22) Filed: Jan. 13, 2006

(65) Prior Publication Data

US 2006/0129888 A1  Jun. 15, 2006

(51) Int. Cl.
*H01L 23/34* (2006.01)
*H01L 21/00* (2006.01)
*H05K 7/20* (2006.01)

(52) U.S. Cl. .................. 257/707; 257/713; 257/717; 257/720; 257/724; 257/E23.051; 257/E23.008; 257/E23.065; 257/E23.167; 257/E23.177; 361/707; 361/709; 361/711; 438/122; 438/125

(58) Field of Classification Search ................ None
See application file for complete search history.

(56) References Cited

U.S. PATENT DOCUMENTS

| | | | |
|---|---|---|---|
| 3,372,310 A | 3/1968 | Kantor |
| 3,436,604 A | 4/1969 | Hyltin |
| 3,582,865 A | 6/1971 | Franck et al. |
| 3,654,394 A | 4/1972 | Gordon |
| 3,704,466 A | 11/1972 | Scarbrough |
| 3,718,842 A | 2/1973 | Abbott, III et al. |
| 3,727,064 A | 4/1973 | Bottini |
| 3,746,934 A | 7/1973 | Stein |
| 3,766,439 A | 10/1973 | Isaacson |
| 3,772,776 A | 11/1973 | Weisenburger |
| 4,169,642 A | 10/1979 | Mouissie |
| 4,288,841 A | 9/1981 | Gogal |
| 4,342,069 A | 7/1982 | Link |
| 4,429,349 A | 1/1984 | Zachry |
| 4,437,235 A | 3/1984 | McIver |
| 4,513,368 A | 4/1985 | Houseman |
| 4,547,834 A | 10/1985 | Dumont et al. |
| 4,567,543 A | 1/1986 | Miniet |
| 4,587,596 A | 5/1986 | Bunnell |

(Continued)

FOREIGN PATENT DOCUMENTS

EP   122-687   10/1984

(Continued)

OTHER PUBLICATIONS

Pages 19-22 of Presentation by Netlist, Aug. 2004.

(Continued)

*Primary Examiner*—Alonzo Chambliss
(74) *Attorney, Agent, or Firm*—Fish & Richardson P.C.

(57) ABSTRACT

Turbulence inducers are provided on circuit modules. Rising above a substrate or heat spreader surface, turbulence generators may be added to existing modules or integrated into substrates or heat spreaders employed by circuit modules constructed according to traditional or new technologies.

19 Claims, 11 Drawing Sheets

U.S. PATENT DOCUMENTS

| | | |
|---|---|---|
| 4,645,944 A | 2/1987 | Uya |
| 4,656,605 A | 4/1987 | Clayton |
| 4,672,421 A | 6/1987 | Lin |
| 4,682,207 A | 7/1987 | Akasaki et al. |
| 4,696,525 A | 9/1987 | Coller et al. |
| 4,709,300 A | 11/1987 | Landis |
| 4,724,611 A | 2/1988 | Hagihara |
| 4,727,513 A | 2/1988 | Clayton |
| 4,733,461 A | 3/1988 | Nakano |
| 4,739,589 A | 4/1988 | Brehm et al. |
| 4,763,188 A | 8/1988 | Johnson |
| 4,771,366 A | 9/1988 | Blake et al. |
| 4,821,007 A | 4/1989 | Fields et al. |
| 4,823,234 A | 4/1989 | Konishi et al. |
| 4,833,568 A | 5/1989 | Berhold |
| 4,850,892 A | 7/1989 | Clayton et al. |
| 4,862,249 A | 8/1989 | Carlson |
| 4,911,643 A | 3/1990 | Perry et al. |
| 4,953,060 A | 8/1990 | Lauffer et al. |
| 4,956,694 A | 9/1990 | Eide |
| 4,972,580 A | 11/1990 | Nakamura |
| 4,982,265 A | 1/1991 | Watanabe et al. |
| 4,983,533 A | 1/1991 | Go |
| 4,985,703 A | 1/1991 | Kaneyama |
| 4,992,849 A | 2/1991 | Corbett et al. |
| 4,992,850 A | 2/1991 | Corbett et al. |
| 5,014,115 A | 5/1991 | Moser |
| 5,014,161 A | 5/1991 | Lee et al. |
| 5,016,138 A | 5/1991 | Woodman |
| 5,025,306 A | 6/1991 | Johnson et al. |
| 5,034,350 A | 7/1991 | Marchisi |
| 5,041,015 A | 8/1991 | Travis |
| 5,053,853 A | 10/1991 | Haj-Ali-Ahmadi et al. |
| 5,065,277 A | 11/1991 | Davidson |
| 5,099,393 A | 3/1992 | Bentlage et al. |
| 5,104,820 A | 4/1992 | Go et al. |
| 5,109,318 A | 4/1992 | Funari et al. |
| 5,117,282 A | 5/1992 | Salatino |
| 5,119,269 A | 6/1992 | Nakayama |
| 5,138,430 A | 8/1992 | Gow, III et al. |
| 5,138,434 A | 8/1992 | Wood et al. |
| 5,140,405 A | 8/1992 | King et al. |
| 5,159,535 A | 10/1992 | Desai et al. |
| 5,173,840 A | 12/1992 | Kodai et al. |
| 5,191,404 A | 3/1993 | Wu et al. |
| 5,208,729 A | 5/1993 | Cipolla et al. |
| 5,214,845 A | 6/1993 | King et al. |
| 5,219,377 A | 6/1993 | Poradish |
| 5,222,014 A | 6/1993 | Lin |
| 5,224,023 A | 6/1993 | Smith et al. |
| 5,229,916 A | 7/1993 | Frankeny et al. |
| 5,229,917 A | 7/1993 | Harris et al. |
| 5,239,198 A | 8/1993 | Lin et al. |
| 5,241,454 A | 8/1993 | Ameen et al. |
| 5,241,456 A | 8/1993 | Marcinkiewicz et al. |
| 5,247,423 A | 9/1993 | Lin et al. |
| 5,252,857 A | 10/1993 | Kane et al. |
| 5,259,770 A | 11/1993 | Bates et al. |
| 5,261,068 A | 11/1993 | Gaskins et al. |
| 5,268,815 A | 12/1993 | Cipolla et al. |
| 5,276,418 A | 1/1994 | Klosowiak et al. |
| 5,281,852 A | 1/1994 | Normington |
| 5,285,398 A | 2/1994 | Janik |
| 5,289,062 A | 2/1994 | Wyland |
| 5,309,986 A | 5/1994 | Itoh |
| 5,313,097 A | 5/1994 | Haj-Ali-Ahmadi et al. |
| 5,347,428 A | 9/1994 | Carson et al. |
| 5,362,656 A | 11/1994 | McMahon |
| 5,375,041 A | 12/1994 | McMahon |
| 5,386,341 A | 1/1995 | Olson et al. |
| 5,394,300 A | 2/1995 | Yoshimura |
| 5,397,916 A | 3/1995 | Normington |
| 5,400,003 A | 3/1995 | Kledzik |
| 5,428,190 A | 6/1995 | Stopperan |
| 5,438,224 A | 8/1995 | Papageorge et al. |
| 5,448,511 A | 9/1995 | Paurus et al. |
| 5,477,082 A | 12/1995 | Buckley, III et al. |
| 5,491,612 A | 2/1996 | Nicewarner, Jr. |
| 5,502,333 A | 3/1996 | Bertin et al. |
| 5,523,619 A | 6/1996 | McAllister et al. |
| 5,523,695 A | 6/1996 | Lin |
| 5,541,812 A | 7/1996 | Burns |
| 5,572,065 A | 11/1996 | Burns |
| 5,600,178 A | 2/1997 | Russell |
| 5,612,570 A | 3/1997 | Eide et al. |
| 5,631,193 A | 5/1997 | Burns |
| 5,642,055 A | 6/1997 | Difrancesco |
| 5,644,161 A | 7/1997 | Burns |
| 5,646,446 A | 7/1997 | Nicewarner et al. |
| 5,654,877 A | 8/1997 | Burns |
| 5,661,339 A | 8/1997 | Clayton |
| 5,686,730 A | 11/1997 | Laudon et al. |
| 5,688,606 A | 11/1997 | Mahulikar et al. |
| 5,708,297 A | 1/1998 | Clayton |
| 5,714,802 A | 2/1998 | Cloud et al. |
| 5,717,556 A | 2/1998 | Yanagida |
| 5,729,894 A | 3/1998 | Rostoker et al. |
| 5,731,633 A | 3/1998 | Clayton |
| 5,744,862 A | 4/1998 | Ishii |
| 5,751,553 A | 5/1998 | Clayton |
| 5,754,409 A | 5/1998 | Smith |
| 5,764,497 A | 6/1998 | Mizumo |
| 5,776,797 A | 7/1998 | Nicewarner, Jr. et al. |
| 5,789,815 A | 8/1998 | Tessier et al. |
| 5,790,447 A | 8/1998 | Laudon et al. |
| 5,802,395 A | 9/1998 | Connolly et al. |
| 5,805,422 A | 9/1998 | Otake et al. |
| 5,828,125 A | 10/1998 | Burns |
| 5,835,988 A | 11/1998 | Ishii |
| 5,869,353 A | 2/1999 | Levy et al. |
| 5,899,705 A | 5/1999 | Akram |
| 5,917,709 A | 6/1999 | Johnson et al. |
| 5,925,934 A | 7/1999 | Lim |
| 5,926,369 A | 7/1999 | Ingraham et al. |
| 5,949,657 A | 9/1999 | Karabatsos |
| 5,953,214 A | 9/1999 | Dranchak et al. |
| 5,953,215 A | 9/1999 | Karabatsos |
| 5,959,839 A | 9/1999 | Gates |
| 5,963,427 A | 10/1999 | Bollesen |
| 5,973,395 A | 10/1999 | Suzuki et al. |
| 5,995,370 A | 11/1999 | Nakamori |
| 6,002,167 A | 12/1999 | Hatano et al. |
| 6,002,589 A | 12/1999 | Perino et al. |
| 6,008,538 A | 12/1999 | Akram et al. |
| 6,014,316 A | 1/2000 | Eide |
| 6,021,048 A | 2/2000 | Smith |
| 6,025,992 A | 2/2000 | Dodge et al. |
| 6,028,352 A | 2/2000 | Eide |
| 6,028,365 A | 2/2000 | Akram et al. |
| 6,034,878 A | 3/2000 | Osaka et al. |
| 6,038,132 A | 3/2000 | Tokunaga et al. |
| 6,040,624 A | 3/2000 | Chambers et al. |
| 6,049,975 A | 4/2000 | Clayton |
| 6,060,339 A | 5/2000 | Akram et al. |
| 6,072,233 A | 6/2000 | Corisis et al. |
| 6,078,515 A | 6/2000 | Nielsen et al. |
| 6,084,294 A | 7/2000 | Tomita |
| 6,091,145 A | 7/2000 | Clayton |
| 6,097,087 A | 8/2000 | Farnworth et al. |
| 6,111,757 A | 8/2000 | Dell et al. |
| 6,121,676 A | 9/2000 | Solberg |
| RE36,916 E | 10/2000 | Moshayedi |
| 6,157,541 A | 12/2000 | Hacke |
| 6,172,874 B1 | 1/2001 | Bartilson |

| Patent | Date | Inventor |
|---|---|---|
| 6,178,093 B1 | 1/2001 | Bhatt et al. |
| 6,180,881 B1 | 1/2001 | Isaak |
| 6,187,652 B1 | 2/2001 | Chou et al. |
| 6,205,654 B1 | 3/2001 | Burns |
| 6,208,521 B1 | 3/2001 | Nakatsuka |
| 6,208,546 B1 | 3/2001 | Ikeda |
| 6,214,641 B1 | 4/2001 | Akram |
| 6,215,181 B1 | 4/2001 | Akram et al. |
| 6,215,687 B1 | 4/2001 | Sugano et al. |
| 6,222,737 B1 | 4/2001 | Ross |
| 6,222,739 B1 | 4/2001 | Bhakta et al. |
| 6,226,660 B1 | 5/2001 | Kim et al. |
| 6,232,659 B1 | 5/2001 | Clayton |
| 6,233,650 B1 | 5/2001 | Johnson et al. |
| 6,234,820 B1 | 5/2001 | Perino et al. |
| 6,262,476 B1 | 7/2001 | Vidal |
| 6,262,895 B1 | 7/2001 | Forthun |
| 6,265,660 B1 | 7/2001 | Tandy |
| 6,266,252 B1 | 7/2001 | Karabatsos |
| 6,281,577 B1 | 8/2001 | Oppermann et al. |
| 6,288,907 B1 | 9/2001 | Burns |
| 6,288,924 B1 | 9/2001 | Sugano et al. |
| 6,300,679 B1 | 10/2001 | Mukerji et al. |
| 6,316,825 B1 | 11/2001 | Park et al. |
| 6,323,060 B1 | 11/2001 | Isaak |
| 6,336,262 B1 | 1/2002 | Dalal et al. |
| 6,343,020 B1 | 1/2002 | Lin et al. |
| 6,347,394 B1 | 2/2002 | Ochoa et al. |
| 6,349,050 B1 | 2/2002 | Woo et al. |
| 6,351,029 B1 | 2/2002 | Isaak |
| 6,357,023 B1 | 3/2002 | Co et al. |
| 6,358,772 B2 | 3/2002 | Miyoshi |
| 6,360,433 B1 | 3/2002 | Ross |
| 6,368,896 B2 | 4/2002 | Farnworth et al. |
| 6,370,668 B1 | 4/2002 | Garrett, Jr. et al. |
| 6,376,769 B1 | 4/2002 | Chung |
| 6,392,162 B1 | 5/2002 | Karabatsos |
| 6,404,043 B1 | 6/2002 | Isaak |
| 6,410,857 B1 | 6/2002 | Gonya |
| 6,426,240 B2 | 7/2002 | Isaak |
| 6,426,549 B1 | 7/2002 | Isaak |
| 6,426,560 B1 | 7/2002 | Kawamura et al. |
| 6,428,360 B2 | 8/2002 | Hassanzadeh et al. |
| 6,433,418 B1 | 8/2002 | Fujisawa et al. |
| 6,444,921 B1 | 9/2002 | Wang et al. |
| 6,446,158 B1 | 9/2002 | Karabatsos |
| 6,449,159 B1 | 9/2002 | Haba |
| 6,452,826 B1 | 9/2002 | Kim et al. |
| 6,459,152 B1 | 10/2002 | Tomita et al. |
| 6,462,412 B2 | 10/2002 | Kamei et al. |
| 6,465,877 B1 | 10/2002 | Farnworth et al. |
| 6,465,893 B1 | 10/2002 | Khandros et al. |
| 6,472,735 B2 | 10/2002 | Isaak |
| 6,473,308 B2 | 10/2002 | Forthun |
| 6,486,544 B1 | 11/2002 | Hashimoto |
| 6,489,687 B1 | 12/2002 | Hashimoto |
| 6,502,161 B1 | 12/2002 | Perego et al. |
| 6,514,793 B2 | 2/2003 | Isaak |
| 6,521,984 B2 | 2/2003 | Matsuura |
| 6,528,870 B2 | 3/2003 | Fukatsu et al. |
| 6,531,772 B2 | 3/2003 | Akram et al. |
| 6,544,815 B2 | 4/2003 | Isaak |
| 6,552,910 B1 | 4/2003 | Moon et al. |
| 6,552,948 B2 | 4/2003 | Woo et al. |
| 6,560,117 B2 | 5/2003 | Moon |
| 6,566,746 B2 | 5/2003 | Isaak et al. |
| 6,572,387 B2 | 6/2003 | Burns et al. |
| 6,573,593 B1 | 6/2003 | Syri et al. |
| 6,576,992 B1 | 6/2003 | Cady et al. |
| 6,588,095 B2 | 7/2003 | Pan |
| 6,590,282 B1 | 7/2003 | Wang et al. |
| 6,600,222 B1 | 7/2003 | Levardo |
| 6,614,664 B2 | 9/2003 | Lee |
| 6,627,984 B2 | 9/2003 | Bruce et al. |
| 6,629,855 B1 | 10/2003 | North et al. |
| 6,646,936 B2 | 11/2003 | Hamamatsu et al. |
| 6,660,561 B2 | 12/2003 | Forthun |
| 6,661,092 B2 | 12/2003 | Shibata et al. |
| 6,677,670 B2 | 1/2004 | Kondo |
| 6,683,377 B1 | 1/2004 | Shim et al. |
| 6,690,584 B2 | 2/2004 | Uzuka et al. |
| 6,699,730 B2 | 3/2004 | Kim et al. |
| 6,720,652 B2 | 4/2004 | Akram et al. |
| 6,721,181 B1 | 4/2004 | Pfeifer et al. |
| 6,721,185 B2 | 4/2004 | Dong et al. |
| 6,721,226 B2 | 4/2004 | Woo et al. |
| 6,744,656 B2 | 6/2004 | Sugano et al. |
| 6,751,113 B2 | 6/2004 | Bhakta et al. |
| 6,756,661 B2 | 6/2004 | Tsuneda et al. |
| 6,760,220 B2 | 7/2004 | Canter et al. |
| 6,762,942 B1 | 7/2004 | Smith |
| 6,768,660 B2 | 7/2004 | Kong et al. |
| 6,833,981 B2 | 12/2004 | Suwabe et al. |
| 6,833,984 B1 | 12/2004 | Belgacem |
| 6,839,266 B1 | 1/2005 | Garrett, Jr. et al. |
| 6,841,868 B2 | 1/2005 | Akram et al. |
| 6,850,414 B2 | 2/2005 | Benisek et al. |
| 6,873,534 B2 | 3/2005 | Bhakta et al. |
| 6,878,571 B2 | 4/2005 | Isaak et al. |
| 6,884,653 B2 | 4/2005 | Larson |
| 6,914,324 B2 | 7/2005 | Rapport et al. |
| 6,919,626 B2 | 7/2005 | Burns |
| 6,956,284 B2 | 10/2005 | Cady et al. |
| 7,053,478 B2 | 5/2006 | Roper et al. |
| 7,094,632 B2 | 8/2006 | Cady et al. |
| 7,180,167 B2 | 2/2007 | Partridge et al. |
| 7,393,226 B2 | 7/2008 | Clayton et al. |
| 7,394,149 B2 | 7/2008 | Clayton et al. |
| 7,446,410 B2 * | 11/2008 | Wehrly et al. ............... 257/707 |
| 2001/0001085 A1 | 5/2001 | Hassanzadeh et al. |
| 2001/0006252 A1 | 7/2001 | Kim et al. |
| 2001/0013423 A1 | 8/2001 | Dalal et al. |
| 2001/0015487 A1 | 8/2001 | Forthun |
| 2001/0026009 A1 | 10/2001 | Tsuneda et al. |
| 2001/0028588 A1 | 10/2001 | Yamada et al. |
| 2001/0035572 A1 | 11/2001 | Isaak |
| 2001/0040793 A1 | 11/2001 | Inaba |
| 2001/0052637 A1 | 12/2001 | Akram et al. |
| 2002/0001216 A1 | 1/2002 | Sugano et al. |
| 2002/0006032 A1 | 1/2002 | Karabatsos |
| 2002/0030995 A1 | 3/2002 | Shoji |
| 2002/0076919 A1 | 6/2002 | Peters et al. |
| 2002/0094603 A1 | 7/2002 | Isaak |
| 2002/0101261 A1 | 8/2002 | Karabatsos |
| 2002/0139577 A1 | 10/2002 | Miller |
| 2002/0164838 A1 | 11/2002 | Moon et al. |
| 2002/0180022 A1 | 12/2002 | Emoto |
| 2002/0185731 A1 | 12/2002 | Akram et al. |
| 2002/0196612 A1 | 12/2002 | Gall et al. |
| 2003/0002262 A1 | 1/2003 | Benisek et al. |
| 2003/0026155 A1 | 2/2003 | Yamagata |
| 2003/0035328 A1 | 2/2003 | Hamamatsu et al. |
| 2003/0045025 A1 | 3/2003 | Coyle et al. |
| 2003/0049886 A1 | 3/2003 | Salmon |
| 2003/0064548 A1 | 4/2003 | Isaak |
| 2003/0081387 A1 | 5/2003 | Schulz |
| 2003/0081392 A1 | 5/2003 | Cady et al. |
| 2003/0089978 A1 | 5/2003 | Miyamoto et al. |
| 2003/0090879 A1 | 5/2003 | Doblar et al. |
| 2003/0096497 A1 | 5/2003 | Moore et al. |
| 2003/0109078 A1 | 6/2003 | Takahashi et al. |
| 2003/0116835 A1 | 6/2003 | Miyamoto et al. |
| 2003/0159278 A1 | 8/2003 | Peddle |
| 2003/0168725 A1 | 9/2003 | Warner et al. |
| 2004/0000708 A1 | 1/2004 | Rapport et al. |
| 2004/0012991 A1 | 1/2004 | Kozaru |

| | | | |
|---|---|---|---|
| 2004/0021211 A1 | 2/2004 | Damberg | |
| 2004/0099938 A1 | 5/2004 | Kang et al. | |
| 2004/0150107 A1 | 8/2004 | Cha et al. | |
| 2004/0229402 A1 | 11/2004 | Cady et al. | |
| 2004/0236877 A1 | 11/2004 | Burton | |
| 2005/0082663 A1 | 4/2005 | Wakiyama et al. | |
| 2005/0108468 A1 | 5/2005 | Hazelzet et al. | |
| 2005/0133897 A1 | 6/2005 | Baek et al. | |
| 2005/0242423 A1 | 11/2005 | Partridge et al. | |
| 2005/0263911 A1 | 12/2005 | Igarashi et al. | |
| 2006/0020740 A1 | 1/2006 | Bartley et al. | |
| 2006/0050489 A1* | 3/2006 | Wehrly et al. | 361/749 |
| 2006/0050496 A1 | 3/2006 | Goodwin | |
| 2006/0050497 A1 | 3/2006 | Goodwin | |
| 2006/0053345 A1 | 3/2006 | Goodwin | |
| 2006/0091529 A1 | 5/2006 | Wehrly et al. | |
| 2006/0095592 A1 | 5/2006 | Borkenhagen | |
| 2006/0111866 A1 | 5/2006 | LeClerg et al. | |
| 2006/0125067 A1 | 6/2006 | Wehrly et al. | |
| 2006/0250780 A1* | 11/2006 | Goodwin | 361/767 |
| 2007/0211426 A1 | 9/2007 | Clayton et al. | |
| 2007/0211711 A1 | 9/2007 | Clayton | |
| 2007/0212906 A1 | 9/2007 | Clayton et al. | |
| 2007/0212920 A1 | 9/2007 | Clayton et al. | |
| 2008/0192428 A1 | 8/2008 | Clayton et al. | |

FOREIGN PATENT DOCUMENTS

| | | |
|---|---|---|
| EP | 0 298 211 A3 | 1/1989 |
| EP | 1 119 049 | 7/2001 |
| GB | 2 130 025 A | 5/1984 |
| JP | 53-85159 | 7/1978 |
| JP | 58-96756 | 6/1983 |
| JP | 3-102862 | 4/1991 |
| JP | 5-29534 | 2/1993 |
| JP | 5-335695 | 12/1993 |
| JP | 2821315 | 11/1998 |
| JP | 2001/077294 | 3/2001 |
| JP | 2001/085592 | 3/2001 |
| JP | 2001/332683 | 11/2001 |
| JP | 2002/009231 | 1/2002 |
| JP | 2003/037246 | 2/2003 |
| JP | 2003/086760 | 3/2003 |
| JP | 2003/086761 | 3/2003 |
| JP | 2003/309246 | 10/2003 |
| JP | 2003-347503 | 12/2003 |
| WO | WO03/037053 | 5/2003 |
| WO | WO 03/037053 A1 | 5/2003 |
| WO | WO 2004/109802 A1 | 12/2004 |

OTHER PUBLICATIONS

Flexible Printed Circuit Technology—A Versatile Interconnection Option. (Website 2 pages) Fjelstad, Joseph. Dec. 3, 2002.
Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.
Tessera uZ Ball Stack Package. 4 figures that purport to be directed to the uZ—Ball Stacked Memory. Published on the Internet.
Chip Scale Review Online—An Independent Journal Dedicated to the Advancement of Chip-Scale Electronics. (Webiste 9 pages) Fjelstad, Joseph, Pacific Consultants L.I.C., Published Jan. 2001 on Internet.
Flexible Thinking: Examining the Flexible Circuit Tapes. (Website 2 pages) Fjelstad, Joseph.. Published Apr. 20, 2000 on Internet.
Ron Bauer, Intel. "Stacked-CSP Delivers Flexibility, Reliability, and Space-Saving Capabilities", vol. 3. Spring 2002. Published on the Internet.
Tessera Technologies, Inc.—Semiconductor Intellectual Property. Chip Scale Packaging—Website pages (3), Internet.
Tessera Introduces uZ ä—Ball Stacked Memory Package for Computing and Portable Electronic Products Joyce Smaragdis. Tessera Public Relations. Sandy Skees, MCA PR (www.tessera.com/news_events/press_coverage.cfm); 2 figures that purport to be directed to the uZ ä—Ball Stacked Memory Package. Published Jul. 17, 2002 in San Jose. CA.
William R. Newberry, Design Techniques for Ball Grid Arrays, Xynetix Design Systems, Inc., Portland, Maine. Published on the Internet.
Chip Scale Packaging and Redistribution, Paul A. Magill, Glenn A. Rinne, J. Daniel Mis; Wayne C. Machon, Joseph W. Baggs, Unitive Electronics Inc.
Dense-Pac Microsystems, 16 Megabit High Speed CMOS SRAM DPS1MX16MKn3.
Dense-Pac Microsystems, 256 Megabyte CMOS DRAM DP3ED32MS72RW5.
Dense-Pac Microsystems, Breaking Space Barriers, 3-D Technology 1993.
Dense-Pac Microsystems, DPS512X16A3, Ceramic 512K X 16 CMOS SRAM Module.
IBM Preliminary 168 Pin SDRAM Registered DIMM Functional Description & Timing Diagrams.
3D Interconnection for Ultra-Dense Multichip Modules, Christian Val, Thomson-CSF DCS Computer Division. Thierry Lemoine, Thomson-CSF RCM Radar Countermeasures Division.
High Density Memory Packaging Technology High Speed Imaging Applications, Dean Frew, Texas Instruments Incorporated.
Vertically-integrated Package, Alvin Weinberg, Pacesetter, Inc. and W. Kinzy Jones, Florida International University.
U.S. Appl. No. 11/306,803, Chris Karabatsos (Applicant), filed Jan. 11, 2006.
Complaint filed Mar. 8, 2007, in the United States District Court for the District of Massachusetts, Boston Division, Civil Action No. 07 CA 10468 DPW.
Letter dated Sep. 11, 2006, from Chris Karabatsos of Kentron Technologies to John Kelly, President of JEDEC Solid State Technology Association, concerning potential interferences involving U.S. Appl. No. 11/306,803.
PCT/US06/04690 International Search Report, PCT, Jul. 20, 2007.
PCT/US06/06921 International Search Report and Written Opinion, PCT, Jun. 1, 2007.
PCT/US2006/007193, International Search Report and Written Opinion of the International Searching Authority, PCT, Nov. 7, 2007.
PCT/US05/28547 International Search Report and Written Opinion, PCT, Aug. 18, 2006.
PCT/US05/28547 Notification Concerning Transmittal of International Preliminary Report on Patentability, Mar. 15, 2007.
GB 0516622.8 Search Report, May 25, 2006.
PCT/US06/04690 International Search Report, PCT, Feb. 16, 2007.
PCT/US06/38720 International Search Report and Written Opinion, PCT, Apr. 5, 2007.

* cited by examiner

CIRCUIT MODULE TURBULENCE ENHANCEMENT SYSTEMS AND METHODS

FIELD

The present invention relates to systems and methods for improving the thermal performance of high density circuit modules and, in particular, to systems and methods that enhance the efficiency of air cooling DIMMs and similar modules.

BACKGROUND

Memory expansion is one of the many fields where high density circuit module solutions provide space-saving advantages. For example, the well-known DIMM (Dual In-line Memory Module) has been in use for years, in various forms, to provide memory expansion. A typical DIMM includes a conventional PCB (printed circuit board) with memory and supporting digital logic devices mounted on both sides. The DIMM is typically mounted in an area of the host computer system by inserting a contact-bearing edge of the DIMM into a card edge connector.

DIMMs and other circuit modules generate heat. As operating speeds and capacities have increased, systems and methods to shed heat have become more valuable. A variety of systems and methods have been used to dissipate heat from operating circuit modules. For example, forced air has been used for years to cool circuit modules. Heat sinks have also been employed to increase the surface area of a circuit or module and, consequently, increase the surface area from which heat may be conducted to surrounding air. Consequently, many systems have combined forced air flow with increased surface area to provide a system devised to mitigate heat accumulation in DIMMs and other circuitry operating under demanding conditions.

There are, however, reasonable limits to the speeds that may be imparted to air passing over a circuit module. Further, heat sinks increase surface conduction area but do little more. Consequently, what is needed are systems and methods to improve the conduction between a circuit module and nearby airflow.

SUMMARY

Turbulence inducers are provided on circuit modules. Rising above a substrate or heat spreader surface, turbulence generators may be added to existing modules or integrated into substrates or heat spreaders employed by circuit modules constructed according to traditional or new technologies.

DETAILED DESCRIPTION OF PREFERRED EMBODIMENTS

Figure 1:
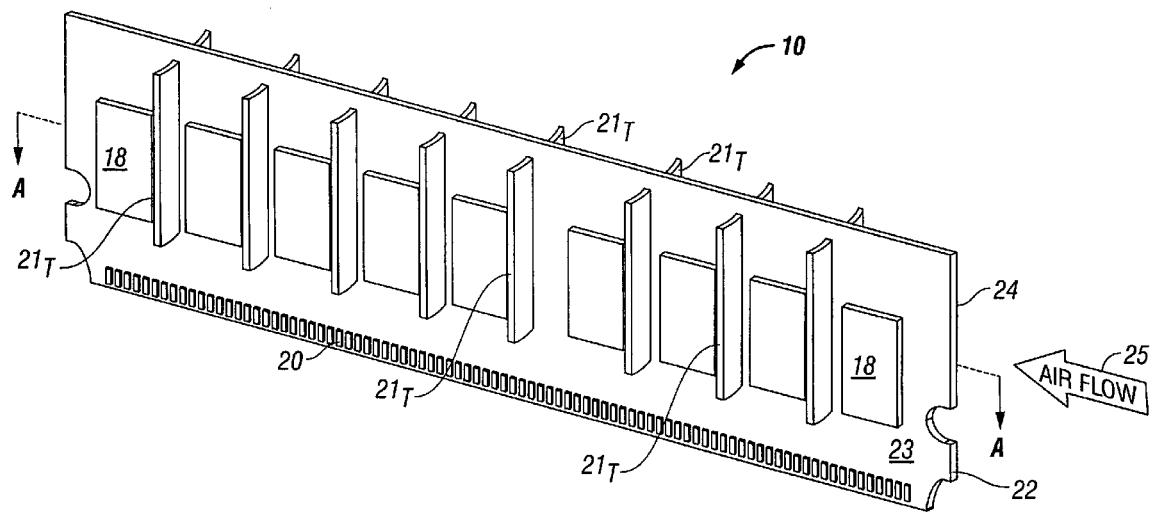
FIG. 1 is a perspective view of a module devised in accordance with a preferred embodiment of the present invention.

FIG. 1 is a perspective view of a module devised in accordance with a preferred embodiment of the present invention. FIG. 1 depicts a conventional circuit module 10 with plural ICs 18 which, in a preferred embodiment, will typically be memory integrated circuits in chip scale packages (CSP). After appreciating this specification, those of skill will, however, note that many types of circuit modules in addition to those with a primary function of memory may benefit from employment of the invention. For example, the invention may be employed with graphics, communications, dedicated computing or other circuit modules where heat extraction is a valued attribute.

In depicted module 10 of FIG. 1, a substrate 22 is populated along each of its surfaces 23 and 24 with plural ICs 18 and exhibits plural contacts 20 configured for insertion into an edge connector socket. It should be understood that the depiction is merely exemplary and the invention is applicable to a wide variety of module constructions both conventional and new, a few example types of which are depicted in later Figs. In the embodiment depicted in FIG. 1, substrate 22 is typically FR4 as commonly found in traditional DIMMs.

Turbulence inducers 21T project from side or surface 23 (as well as the other side 24 in preferred embodiments) of substrate 22. Preferably, turbulence inducers 21T are disposed between ICs 18 disposed along the sides of substrate 22 and may either be integral with substrate 22 or added to module 10 by, for example, being configured as part of a clip for placement over upper edge 26 of substrate 22 as shown in later FIG. 4. Turbulence inducers 21T may be devised of any material with thermally conductive materials being preferred. As those of skill will recognize, turbulence inducers, such as those examples shown in FIG. 1 which are oriented perpendicularly to air flow 25, as well as the long axis of module 10 disturb the laminar air flow and thereby induce mixing of the air passing by module 10. This causes a more uniform heat distribution through the air proximal to module 10 and, therefore, encourages thermal shedding from module 10.

Figure 2:
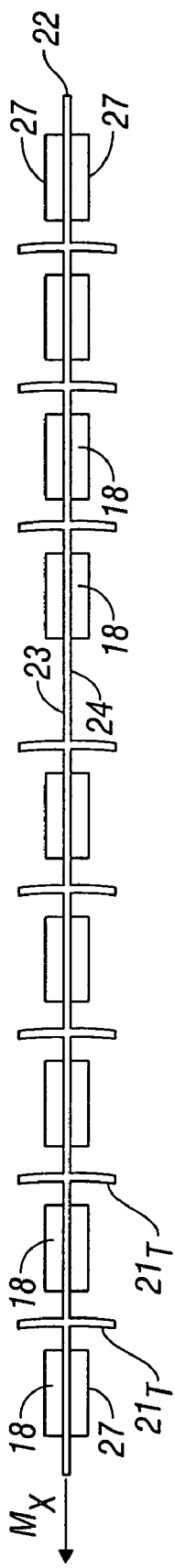
FIG. 2 is a cross-sectional view of a module taken along a line corresponding to line A-A of FIG. 1.

FIG. 2 is a cross-sectional view of a module 10 taken along a line corresponding to line A-A of FIG. 1. Turbulence inducers 21T are shown emergent or rising from sides or surfaces 23 and 24 above the level of upper surfaces 27 of the resident ICs 18 populated along substrate 22. Those of skill will appreciate that the dimensional aspects shown are for illustrative purposes. In the depiction of FIG. 2, turbulence inducers 21T are represented as being configured as a part of substrate 22 and emergent from surfaces 23 and 24 in a direction substantially perpendicular to module long axis $M_X$. In particular, where configured as part of the substrate and particularly if the turbulence inducers can be thermally connected to a core of the substrate, thermal performance may be improved both by conduction from the inducer as well as the disturbance of the laminar air flow induced by the projection of the turbulence inducers into the airflow thus providing two phenomena that can contribute to module cooling. Under some circumstances, however, such integral constructions may be more difficult to implement.

Figure 3:
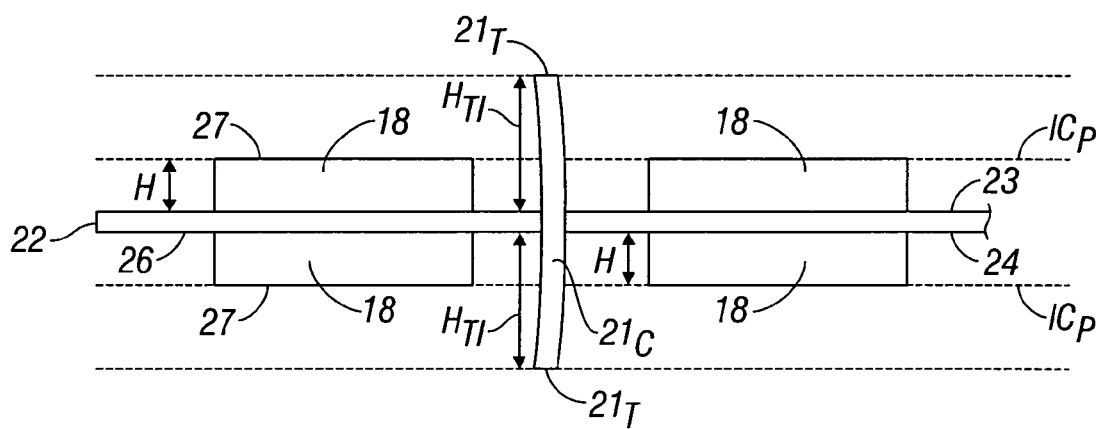
FIG. 3 is an enlarged depiction of a portion of a module and a turbulence inducement clip devised in accordance with a preferred embodiment of the present invention.

FIG. 3 is an enlarged depiction of another preferred embodiment in accordance with the present invention. In the exemplar depiction of FIG. 3, two-sided turbulence inducer clip 21C is depicted disposed over upper edge 26 of substrate 22 of module 10. Turbulence inducers 21T, whether integral with the substrate with which they employed or configured as a separate piece comprising a pair of inducers, as exemplified by the clip depiction of FIG. 3, should be selected and devised to balance the competing considerations of sufficient turbulence generation and excessive obstruction of the air flow 25. As depicted, turbulence inducers 21T have a height "$H_{TT}$" above the respective surface of the substrate. In a preferred embodiment, the height "$H_{TT}$" of turbulence inducers 21T is greater than height "H" which is defined to be the distance from the side of the substrate that is populated with the respective ICs to the upper surface of the respective ICs. When modules that employ a flex circuit disposed about a rigid substrate employ turbulence inducers in accordance with the invention, an embodiment of which is shown in later Figs. herein, height $H_{TT}$ is the height of the turbulence inducer above the populated flex circuit 12 while "H" is the distance above the populated flex circuit 12 to which the respective IC rises as determined by its upper surface 27.

Figure 4:
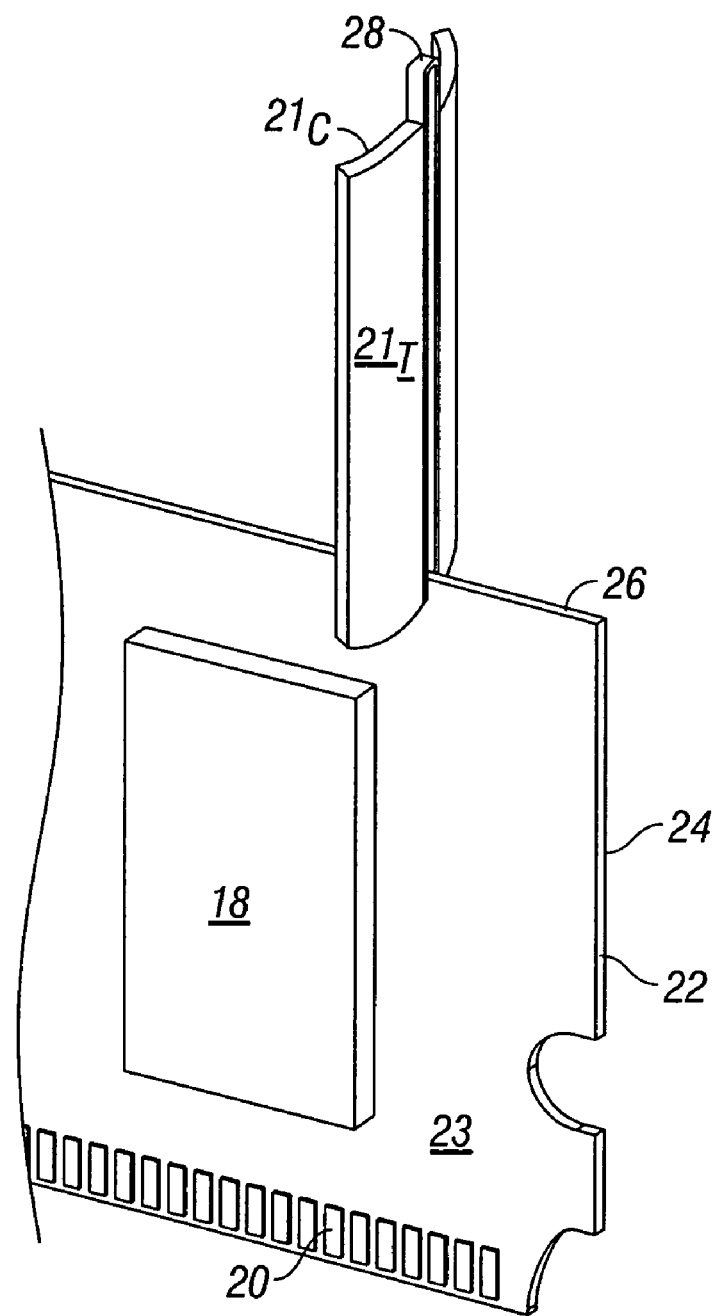
FIG. 4 illustrates an exploded view of a turbulence inducer clip devised for use with a circuit module in accordance with a preferred embodiment of the present invention.

FIG. 4 illustrates an exploded view of a two sided turbulence inducer clip 21C devised for use with a circuit module in accordance with a preferred embodiment of the present invention. As shown in FIG. 4, two-sided turbulence inducer clip 21C is comprised of first and second turbulence inducers 21T connected through connective member 28. Inducer clip 21C is placed over upper edge 26 of substrate 22 to position the first turbulence inducer of the clip between a pair of integrated circuits on a first side of the substrate and the second turbulence inducer of the clip between a second pair of integrated circuits on the second side of the substrate to provide turbulence inducement for circuit modules that employ substrates not originally configured with such inducers. Inducer clip 21C may be made of any configurable material but thermally conductive materials are preferred. Further, as those of skill will recognize, it need not be positioned to result in placement of the turbulence inducers 21T of clip 21C between integrated circuits. Placement adjacent to integrated circuits is also likely to encourage turbulence in proximal airflow.

Figure 5A:
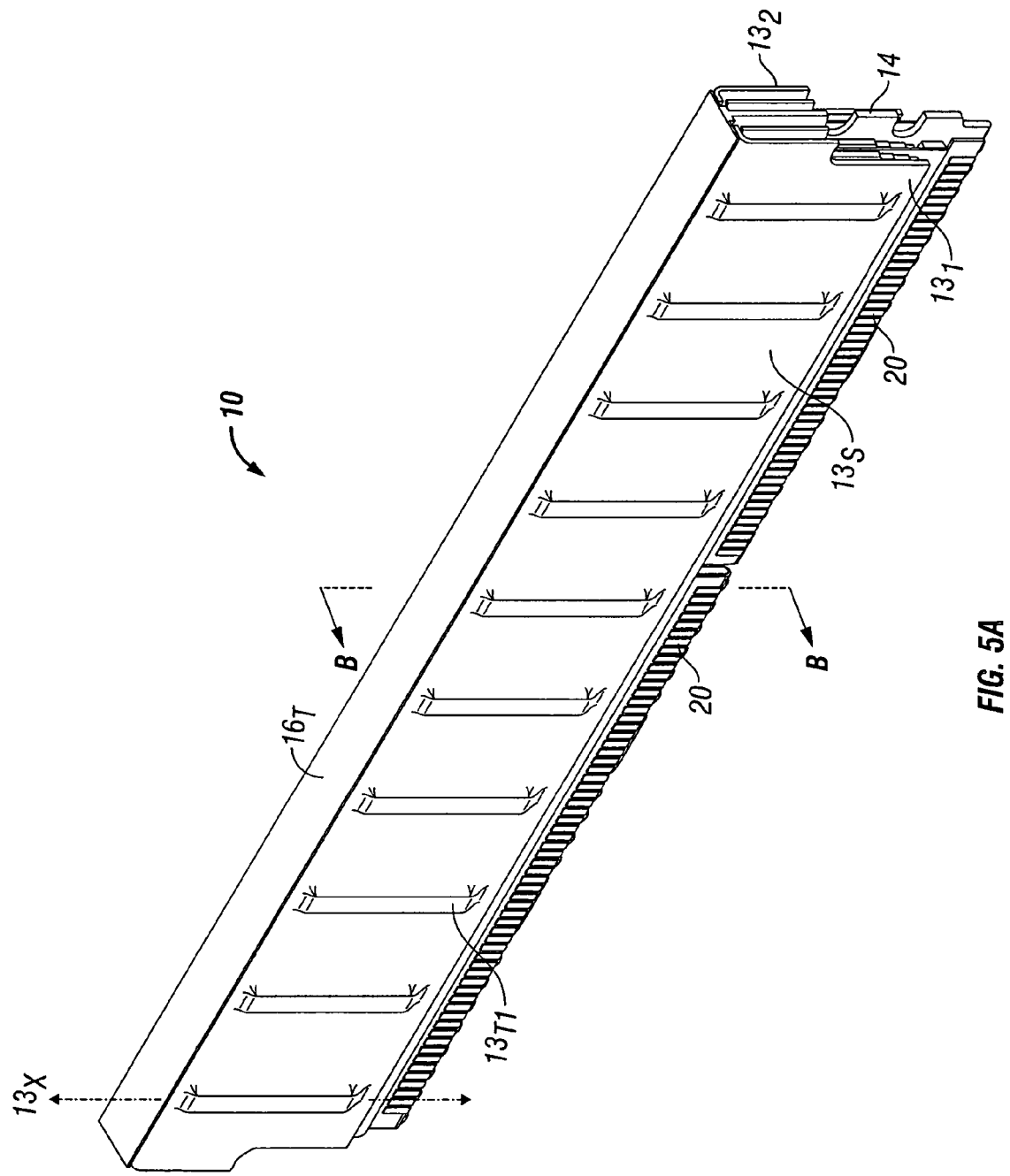
FIG. 5A depicts a circuit module devised in accordance with an alternative embodiment of the present invention.

FIG. 5A depicts a circuit module 10 having thermal spreaders $13_1$ and $13_2$ configured with turbulence inducers 13T1 in accordance with a preferred embodiment of the present invention. The depictions illustrate module 10 having substrate 14 about which is disposed flex circuit 12 populated with ICs 18 which are, in a preferred embodiment, integrated circuitry in CSP packages. ICs 18 are, in this preferred embodiment, CSP packaged memory devices of small scale. For purposes of this disclosure, the term chip-scale or "CSP" shall refer to integrated circuitry of any function with an array package providing connection to one or more die through contacts (often embodied as "bumps" or "balls" for example) distributed across a major surface of the package or die. CSP does not refer to leaded devices that provide connection to an integrated circuit within the package through leads emergent from at least one side of the periphery of the package such as, for example, a TSOP.

Embodiments of the present invention may be employed with modules populated with ICs that are leaded or CSP or in packaged or unpackaged forms but where the term CSP is used, the above definition for CSP should be adopted. Consequently, references to CSP are to be broadly construed to include the large variety of array devices (and not to be limited to memory only) and whether die-sized or other size such as BGA and micro BGA as well as flip-chip. As those of skill will understand after appreciating this disclosure, some embodiments of the present invention may be devised to employ stacks of ICs each disposed where an IC 18 is indicated in the exemplar Figs.

Multiple integrated circuit die may be included in a package depicted as a single IC 18. While in this embodiment memory ICs are used to provide a memory expansion board or module, various embodiments may include a variety of integrated circuits and other components and may be directed principally to functions other than or in addition to memory. Such variety may include processors—whether general purpose or function specific such as graphics, FPGA's, RF transceiver circuitry, and digital logic as a list of non-limiting examples, while primary module functions may include, as a non limiting list of examples, memory, graphics, communications, and computing to name just a few examples. Some modules in accordance with a preferred embodiment will exhibit plural ICs of a first type, such as memory CSPs, for example, and will have at least one IC of a second type, such as a microprocessor, graphics processor or buffer or, more particularly, an AMB, for example. Other modules will exhibit ICs of only a first type such as memory CSPs, for example, while other modules may exhibit many types of ICs such as, for example, memory ICs, logic ICs, and one or more buffer ICs.

Some alternative embodiments will have a separate flex circuit on each side of substrate 14. Substrate 14 is shown with an optional extension 16T which, in this embodiment, is integral with the body of substrate 14.

Optional extension 16T may be devised in a variety of configurations and need not extend laterally from the main axis of substrate 14 in both directions. For example, extension 16T may extend from substrate 14 in only one direction and need not project perpendicular from the body of substrate 14.

Preferably, substrate 14 is comprised of thermally conductive material. For example, aluminum, like many other metallic materials, is thermally conductive and may be readily manipulated for configuration as substrate 14. Carbon-based materials and certain plastics, for example, are known to readily conduct thermal energy and, as alternatives to metallic materials, such materials may be employed to advantage where metallic materials are not available or wanted.

In the depicted embodiment of FIG. 5A, thermal spreaders $13_1$ and $13_2$ are preferably thermally connected to ICs 18 and substrate 14. Thermal spreaders $13_1$ and $13_2$ are comprised of thermally conductive material with higher conductivity metallic materials being preferred. Aluminum is a preferred choice for thermal spreaders in this embodiment due to its amenability to fabrication and relatively high thermal conductivity. Those of skill will, however, recognize that use of copper and copper alloys for thermal spreaders $13_1$ and $13_2$ will typically provide even greater thermal benefits although at typically a higher cost. Thermal spreaders $13_1$ and $13_2$ are preferably thermally connected to ICs 18 (or other ICs where accessible) with thermal adhesive. Turbulence inducers 13T1 are formed in thermal spreaders $13_1$ and $13_2$ to disturb the laminar flow of air along module 10 that is typically encountered in circuit module applications and, in this embodiment, are laterally oriented to be substantially parallel with an axis $13^X$ that is substantially perpendicular to the module axis of module 10.

Figure 5B:
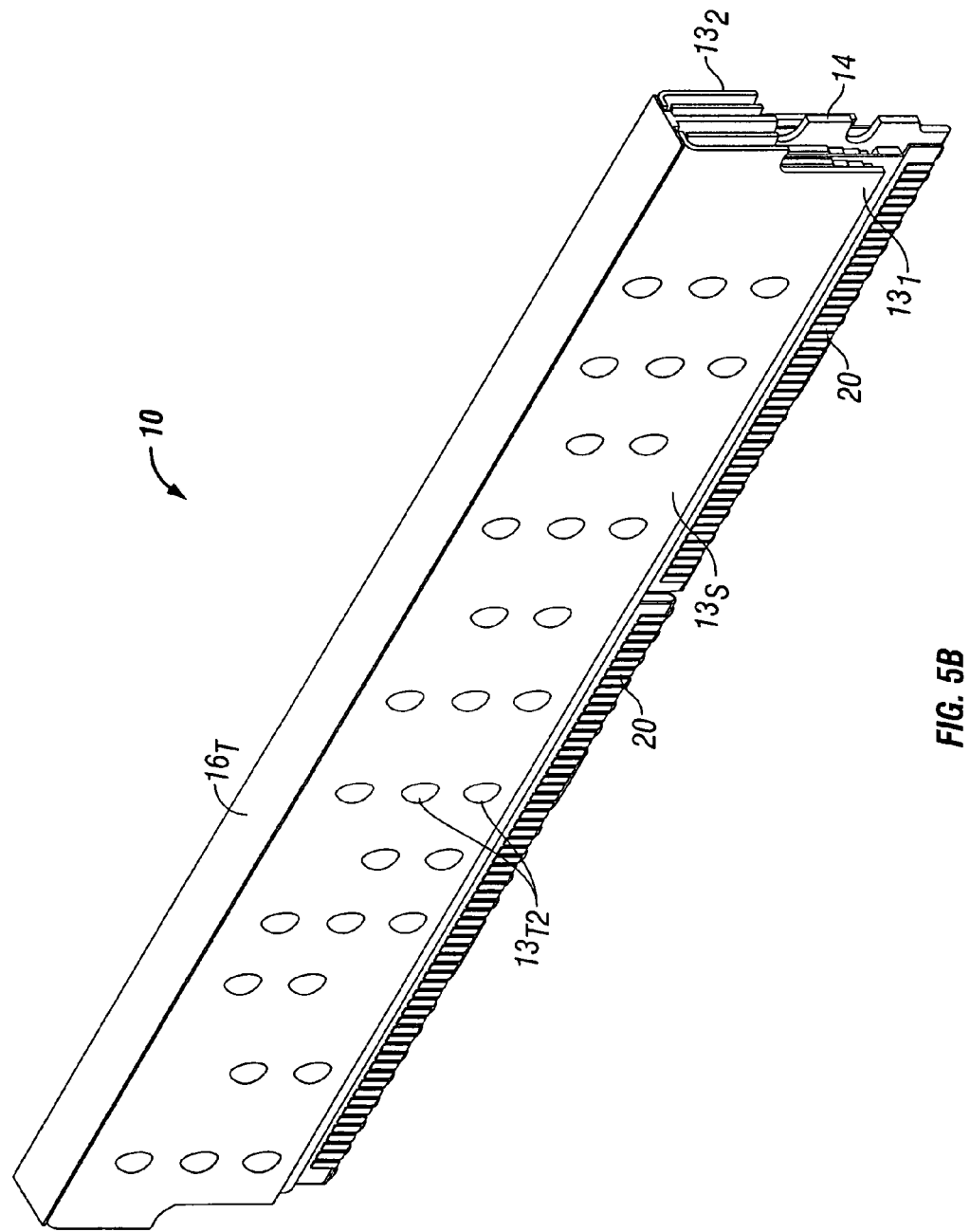
FIG. 5B depicts a circuit module devised in accordance with an alternative preferred embodiment of the present invention.

In the depicted embodiment of FIG. 5B, thermal spreaders $13_1$ and $13_2$ are thermally connected to ICs 18 and substrate 14. Turbulence inducers 13T2 are formed in thermal spreaders $13_1$ and $13_2$ and, in this embodiment, are of a type that rises above surface 13S of thermal spreaders $13_1$ and $13_2$ to disturb the laminar flow of air along module 10 that is typically encountered in circuit module applications. Unlike those turbulence inducers 13T1 shown in FIG. 5A, the turbulence inducers 13T2 shown in FIG. 5B are not characterized as each being oriented perpendicularly to the lengthwise orientation or module axis of module 10.

Figure 5C:
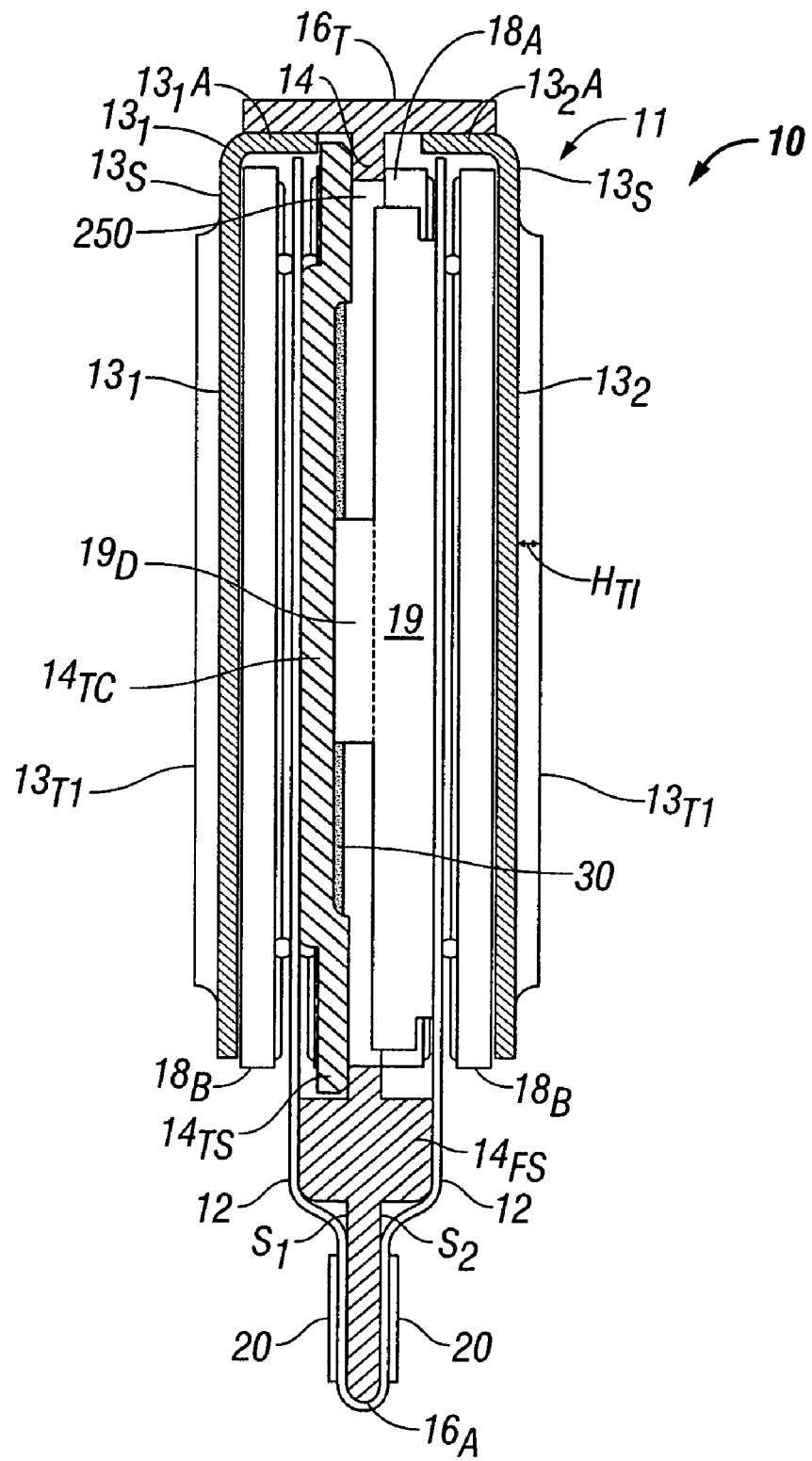
FIG. 5C depicts a cross-sectional view of a circuit module devised in accordance with an alternative embodiment of the present invention.

FIG. 5C depicts a cross-sectional view of a module 10 devised in accordance with an alternative preferred embodiment. FIG. 5C is a cross-sectional view of an exemplar module 10 that employs a larger IC 19 such as an AMB 19. The view of FIG. 5C is along a line near the center of the depicted exemplar module and along a line that corresponds to line B-B shown in FIG. 5A. As shown in FIG. 5C, an optional thermal sink 14TS is in thermal contact with AMB 19. Thermal sink 14TS is comprised, in this preferred embodiment, from metallic material of high thermal conductivity such as, for example, copper or copper alloy and has, in this preferred embodiment, a central portion 14TC that is a copper field substantially larger than and preferably in thermal contact with IC (AMB in this embodiment) 19. AMB die 19D is in contact with area 14TC of thermal sink 14TS either directly, or through thermally conductive adhesive 30 or a thermally conductive gasket material, for example. Thermal contact with a part of circuit 19 should be considered thermal contact with circuit 19.

In this preferred embodiment, central portion 14TC of thermal sink 14TS is raised above the periphery of thermal sink 14TS and additionally provides an indentation into which may be introduced at least a portion of AMB circuit 19 such as, for example, AMB die 19D, to assist in realization of a low profile for module 10. Neither thermal sink 14TS nor an indentation are required, however, to practice the invention. In the preferred depicted embodiment, thermal sink 14TS is disposed over a window 250 through substrate 14. AMB circuit 19, which is mounted on the "inside" of flex circuit 12, is disposed, at least in part, into window 250 from the "back" side of substrate 14 to realize thermal contact with thermal sink 14TS to provide a conduit to reduce thermal energy loading of AMB circuit 19.

Thermal sink 14TS need not cover the entirety of window 250. In other embodiments, for example, thermal sink 14TS may merely be across the window 250 or thermal sink 14TS may be set into window 250 instead of over or across the opening of window 250. Thermal sink 14TS is typically a separate piece of metal from substrate 14 but, after appreciating this specification, those of skill will recognize that, in alternative instances, thermal sink 14TS may be integral with substrate 14 or a particular portion of substrate 14 may be constructed to be a thermal sink 14TS in accordance with the teachings herein. For example, substrate 14 may be comprised of aluminum, while a thermal sink area 14TS of substrate 14 may be comprised of copper yet substrate 14 and thermal sink 14TS are of a single piece. In a variation of the integral thermal sink-substrate embodiment, the thermal sink could be attached to the substrate without a window and thus be preferentially accessible only on one side of substrate 14. Construction expense will be more likely to militate against such construction but the principles of the invention encompass such constructions. Consequently, a window in substrate 14 is not required to practice some embodiments of the invention. Therefore, a thermal sink 14TS should be considered to be an area or element integral with or attached to a substrate 14 and the material from which that thermal sink is composed exhibits greater thermal conductivity than the material of the substrate. To continue the example, substrate 14 may be aluminum while thermal sink 14TS is comprised of copper.

Substrate 14 has first and second lateral sides identified as $S_1$ and $S_2$. Flex 12 is wrapped about perimeter edge 16A of substrate 14. Some alternative embodiments may employ individual flex circuits on each side of substrate 14. As shown in FIG. 5C, AMB circuit 19 is mounted on the inner side of flex circuit 12. When flex circuit 12 is disposed about substrate 14, AMB circuit 19 is introduced, at least in part, into window 250 with AMB die 19D being disposed, preferably, in thermal contact with thermal sink 14TS of substrate 14. That thermal contact is preferably through thermally conductive adhesive 30 but, in an alternative embodiment, another preferred construction may place AMB die 19D in direct physical contact with thermal sink 14TS to realize the thermal contact or connection between AMB circuit 19 and thermal sink 14TS. Other thermal conduction enhancing materials may also be used in place of, or addition to thermal adhesive 30 such as for example, thermal grease or a thermal gasket.

In FIG. 5C, thermal spreaders $13_1$ and $13_2$ exhibit optional thermal spreader extensions $13_1$A and $13_2$A which in cooperation with substrate extension 16T provide a thermal conduction path between substrate 14 and thermal spreaders $13_1$ and $13_2$ and, therefore, between inner ICs 18A (a part of which ICs can be seen in the view) and thermal spreaders $13_1$ and $13_2$. Extensions $13_1$A and $13_2$A also, as shown, in cooperation with extension 16T, form a thermally conductive enclosure 11 over module 10. Turbulence inducers 13T1 are shown on each side of module 10 and rise to a height $H_{TI}$ above surfaces 13S of thermal spreaders $13_1$ and $13_2$, respectively.

Figure 6:
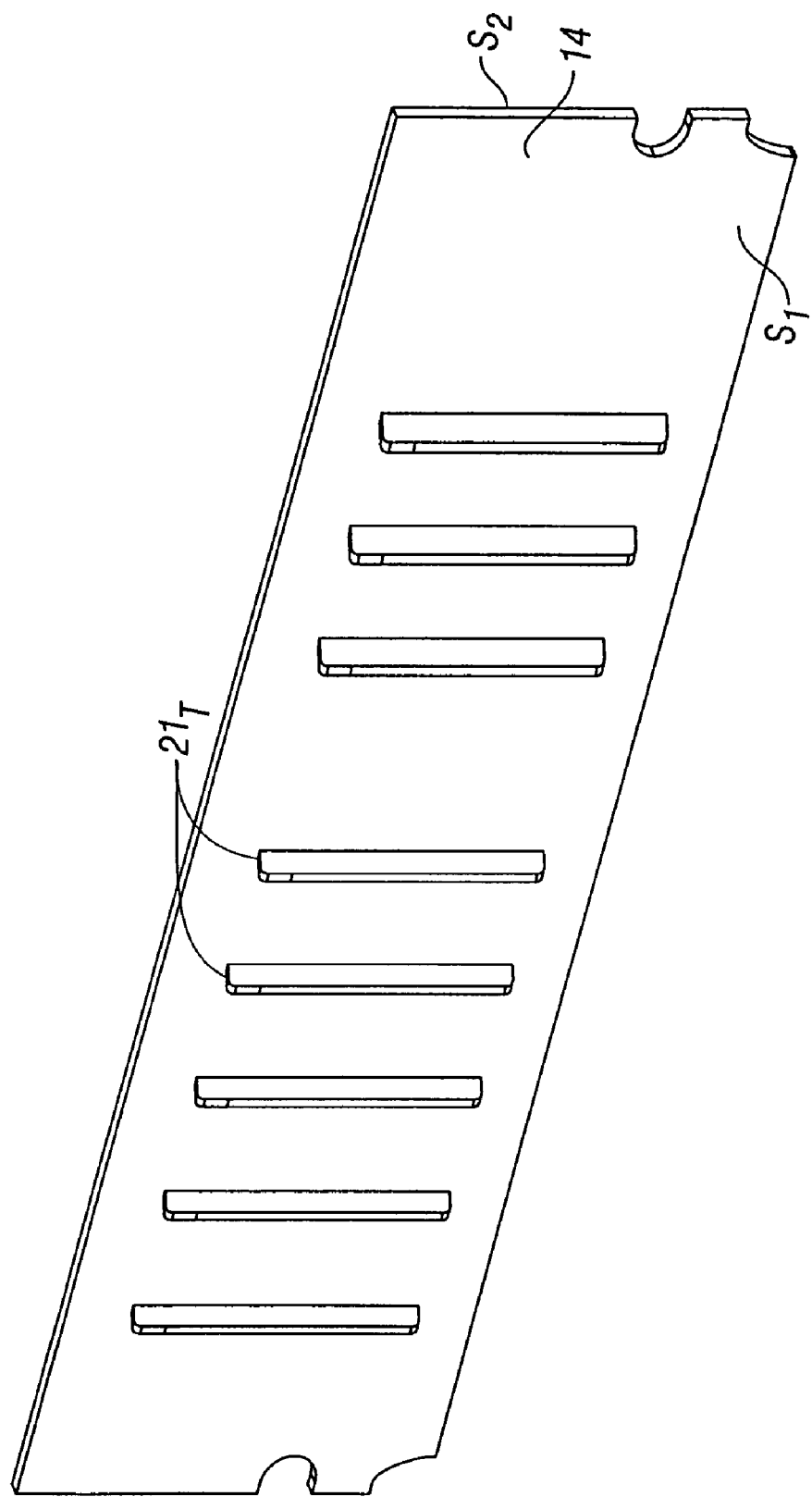
FIG. 6 depicts a rigid substrate that may be employed in accordance with a preferred embodiment of the present invention.

FIG. 6 depicts a rigid substrate that may be employed in accordance with a preferred embodiment of the present invention. Depicted substrate 14 is devised for use with one or more flex circuits that are populated with ICs. Substrate 14 exhibits turbulence inducers 14T which extend from surfaces or sides S1 and S2 of substrate 14.

Figure 7:
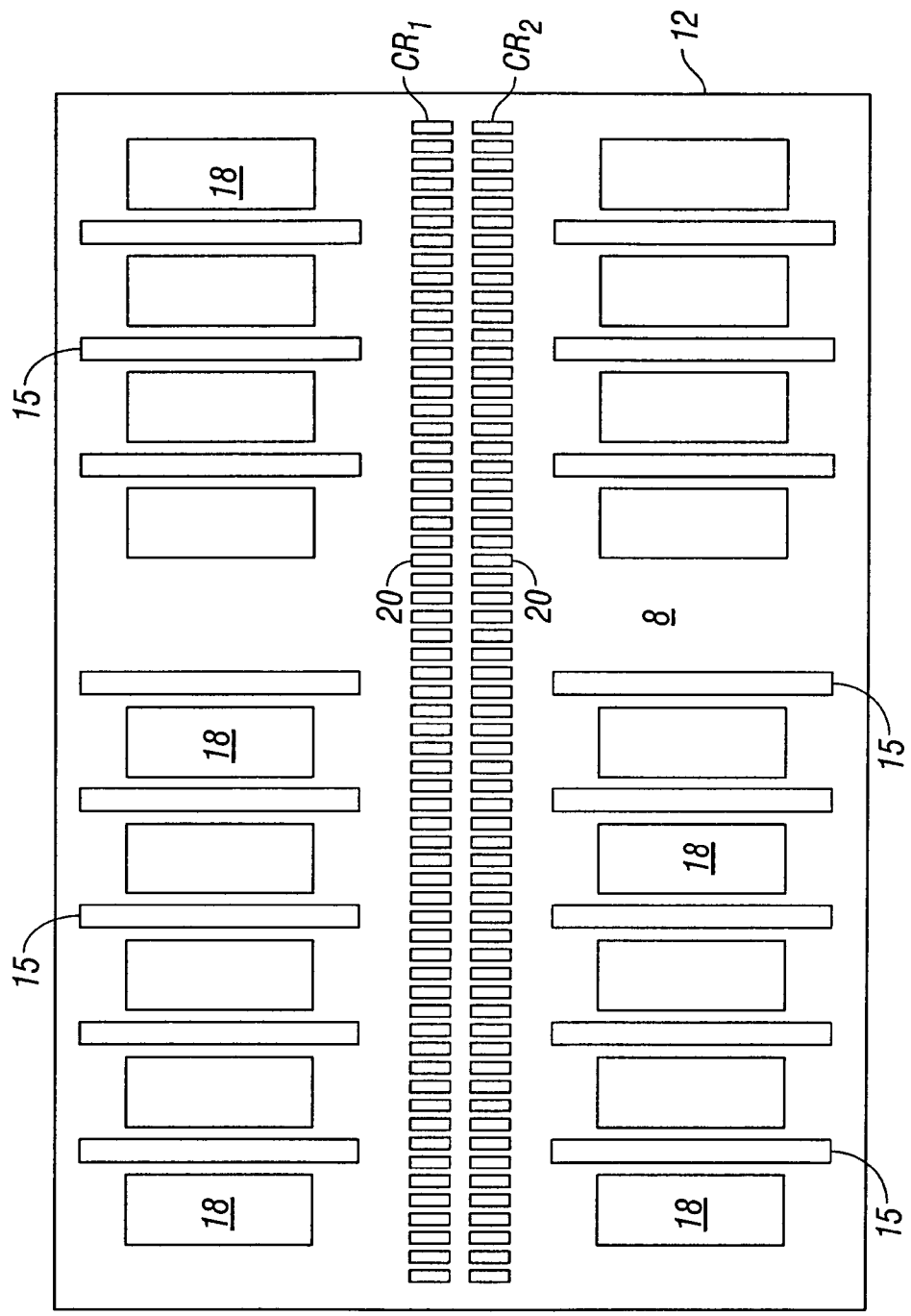
FIG. 7 depicts a flex circuit that may be employed in a module in accordance with a preferred embodiment of the present invention.

FIG. 7 depicts a flex circuit that may be employed to advantage in a module with substrate devised such as the example substrate 14 shown in earlier FIG. 6. Exemplar flex circuit 12 as depicted in FIG. 7, is prepared for population with integrated circuits and, in this depiction, is represented as being populated with first and second fields or ranks of ICs 18 with contacts 20 being disposed between said ranks or fields of ICs 18 and arranged in two pluralities CR1 and CR2. Other embodiments may have other numbers of ranks and combinations of plural ICs connected to create the module of the present invention.

Contacts 20 are configured for insertion in an edge connector socket after flex circuit 12 is disposed about an end of substrate 14. After flex circuit is assembled with substrate 14, those of skill will recognize that contacts 20 may appear on one or both sides of module 10 depending on the mechanical contact interface particulars of the application. Other embodiments may employ flex circuitry that exhibits contacts closer to an edge of the flex circuit.

Slots 15 are provided in flex circuit 12 between integrated circuit locations to allow turbulence inducers 21T of a substrate about which the flex circuit is disposed to emerge from flex circuit slots 15 when flex circuit 12 is disposed about an edge of exemplar substrate 14, for example.

One or both sides of flex circuit 12 may be populated with circuitry such as ICs 18 and, in some embodiments, other ICs such as AMBs may be employed with flex circuit 12 when, for example, a fully-buffered DIMM circuit is implemented.

Figure 8:
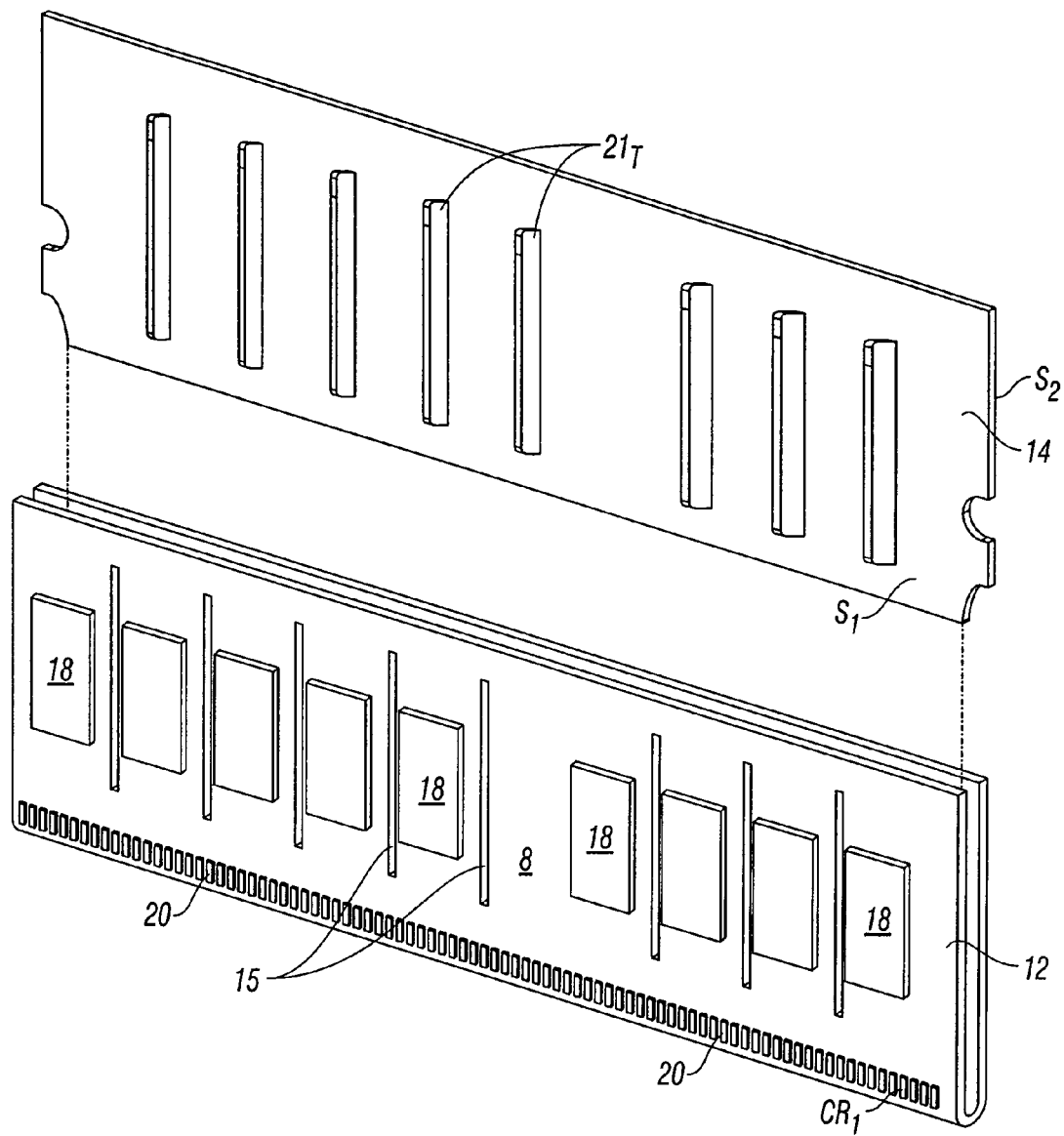
FIG. 8 is an exploded view illustrating how a substrate and flex circuit may be combined in accordance with a preferred embodiment of the present invention.

FIG. 8 is an exploded depiction of flex circuit 12 and substrate 14 showing an example disposition of flex circuit 12 about a substrate to allow turbulence inducers 21T that emerge from the surfaces of rigid substrate 14 to emerge from slots 15 of flex circuit 12 and rise above the upper surfaces of the ICs 18 that populated the flex circuit 12 and, thereby, be positioned to mix the airflow near the module.

Figure 9:
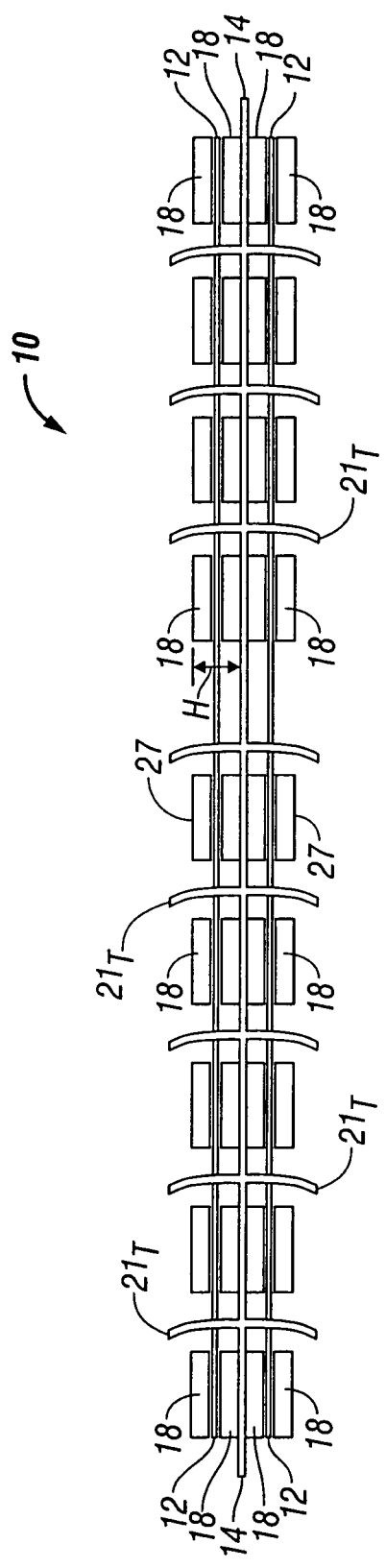
FIG. 9 is a cross-sectional depiction of a module devised in accordance with an alternate preferred embodiment of the present invention.

FIG. 9 is a cross-sectional depiction of another preferred embodiment of a module devised in accordance with the present invention. In the depicted example module 10, flex circuit 12 has been populated on each of its two sides with ICs 18 and disposed about substrate 14. Flex circuit 12 exhibits slots 15 as shown in earlier FIG. 7 to allow turbulence inducers 21T to emerge above the upper surfaces 27 of the ICs 18 that are along the outer side of flex circuit 12. In this example, the height "H" above which turbulence inducers 21T project is determined by an imaginary plane defined by the upper surfaces of the outer ICs 18.

Although the present invention has been described in detail, it will be apparent to those skilled in the art that many embodiments taking a variety of specific forms and reflecting changes, substitutions and alterations can be made without departing from the spirit and scope of the invention. Therefore, the described embodiments illustrate but do not restrict the scope of the claims.

The invention claimed is:

1. A circuit module comprising:
a flex circuit having first and second sides at least one of which sides being configured for population with integrated circuits, the first side of the flex circuit having plural contacts adapted for connection to a circuit board socket and the flex circuit exhibiting a plurality of slots positioned between locations for placement of integrated circuits;
a rigid substrate having an edge and first and second substrate sides, emergent from at least one of the first and second substrate sides there being plural turbulence inducers, the flex circuit being disposed about the edge of the rigid substrate to dispose each of the plural turbulence inducers through individual ones of the slots of the flex circuit.

2. The circuit module of claim 1 in which the rigid substrate is comprised of thermally conductive material.

3. A circuit module comprising:
(a) a rigid substrate having two opposing lateral sides and an edge;
(b) a flex circuit having first and second sides, the first side of the flex circuit having plural contacts adapted for connection to a circuit board socket and at least the first of the first and second sides of the flex circuit being populated with plural memory CSPs, the flex circuit being disposed about the edge of the rigid substrate; and (c) a first thermal spreader having a surface S and which thermal spreader is disposed adjacent to some of the plural memory CSPs, the first thermal spreader being configured with plural turbulence inducers that each rise above the surface S of the first thermal spreader.

4. The circuit module of claim 3 further comprising an AMB and in which circuit module the rigid substrate is comprised of thermally conductive metallic material.

5. The circuit module of claim 3 further comprising a second thermal spreader which is configured with plural turbulence inducers that each rise above surface S of the second thermal spreader.

6. The circuit module of claim 5 in which each of the plural turbulence inducers is oriented substantially parallel to an axis that is perpendicular to a long axis of the circuit module.

7. The circuit module of claim 3 in which the substrate exhibits at least one extension.

8. The circuit module of claim 3 in which both the first and second sides of the flex circuit are populated with plural memory CSPs.

9. The circuit module of claim 3 in which the rigid substrate and the first and second thermal spreaders are comprised of non-metallic, thermally-conductive material.

10. The circuit module of claim 3 in which an extension of the substrate and extensions of the first and second thermal spreaders cooperate to provide a thermal conduction path between the substrate and the first and second thermal spreaders, respectively.

11. A circuit module comprising:
(a) a rigid substrate having first and second surfaces each of which surfaces being populated with integrated circuits that each rise to a height H above the first and second surfaces, respectively; and
(b) plural turbulence inducers that extend from the first and second surfaces to a height of HTI which is greater than H.

12. The circuit module of claim 11 in which the rigid substrate is comprised of thermally conductive material.

13. The circuit module of claim 11 in which the integrated circuits include plural integrated circuits of a first type and at least one integrated circuit of a second type.

14. The circuit module of claim 13 in which the integrated circuits of the first type are CSP memory integrated circuits and the at least one integrated circuit of the second type is an AMB.

15. A circuit module comprising:
a rigid substrate have first and second lateral sides and an edge;
a flex circuit populated with plural ICs and having a set of contacts for insertion in a circuit board edge connector, the flex circuit being disposed about the edge of the substrate to place the flex circuit on each side of the rigid substrate; and
first and second thermal spreaders disposed in thermal connection with and adjacent to selected ones of the plural ICs and each one of which thermal spreaders exhibiting a plurality of turbulence inducers.

16. The circuit module of claim 15 in which the rigid substrate is comprised of thermally conductive material.

17. The circuit module of claim 15 in which the rigid substrate exhibits a substrate extension which forms a part of a thermal path between the rigid substrate and the selected ones of the plural ICs which are adjacent to the first or second thermal spreaders.

18. The circuit module of claim 15 in which the rigid substrate has at least one extension.

19. A circuit module comprising:
(a) a rigid substrate having two opposing lateral sides and an edge and an extension;
(b) a flex circuit having plural contacts adapted for connection to a circuit board socket, the flex circuit being populated with plural CSPs of a first type and at least one CSP of a second type, the flex circuit being disposed about the edge of the rigid substrate to dispose the at least one CSP of the second type in thermal contact with the rigid substrate; and
(c) first and second thermal spreaders each of which is adjacent to at selected ones of the plural CSPs of the first type, each of the first and second thermal spreaders being configured with plural turbulence inducers.

* * * * *

UNITED STATES PATENT AND TRADEMARK OFFICE
CERTIFICATE OF CORRECTION

PATENT NO.       : 7,579,687 B2                                    Page 1 of 1
APPLICATION NO.  : 11/332740
DATED            : August 25, 2009
INVENTOR(S)      : Leland Szewerenko It is certified that error appears in the above-identified patent and that said Letters Patent is hereby corrected as shown below:

On the Title Pg. Item (54) (Title), lines 1-2, delete "CIRCUIT MODULE TURBULENCE ENHANCEMENT SYSTEMS AND METHODS" and insert -- CIRCUIT MODULE TURBULENCE ENHANCEMENT --, therefore.

On the Title Pg. Item (75), after Leland Szewerenko, delete Austin, TX (US) and insert -- Pittsburgh, PA (US); --, therefore.

Column 1, lines 1-2, delete "CIRCUIT MODULE TURBULENCE ENHANCEMENT SYSTEMS AND METHODS" and insert -- CIRCUIT MODULE TURBULENCE ENHANCEMENT --.

In claim 15, column 8, line 49, delete "have" and insert -- having --, therefore.

In claim 19, column 10, line 5, after "to" delete "at", therefore.

Signed and Sealed this

Thirteenth Day of October, 2009

David J. Kappos
*Director of the United States Patent and Trademark Office*